United States Patent [19]

Berenz et al.

[11] Patent Number: 5,528,769
[45] Date of Patent: Jun. 18, 1996

[54] HIGH ELECTRON MOBILITY TRANSISTOR MONOLITHIC INTEGRATED CIRCUIT RECEIVER

[75] Inventors: John J. Berenz, San Pedro; Michael V. Aust; Martin M. Lacon, both of Torrance, all of Calif.

[73] Assignee: TRW Inc., Redondo Beach, Calif.

[21] Appl. No.: 178,587

[22] Filed: Jan. 7, 1994

Related U.S. Application Data

[63] Continuation of Ser. No. 793,909, Nov. 18, 1991, abandoned.

[51] Int. Cl.$^6$ .................................................. H04B 1/28
[52] U.S. Cl. ............................................. 455/333; 455/313
[58] Field of Search ................................... 455/333, 323, 455/326, 332, 313, 327, 253.2, 251.1, 330, 318, 319; 307/529; 333/120, 117; 330/310, 150, 152; 327/356, 564, 566

[56] References Cited

U.S. PATENT DOCUMENTS

| | | | |
|---|---|---|---|
| 4,553,105 | 11/1985 | Sasaki | 455/134 |
| 4,675,911 | 6/1987 | Sakolov et al. | 455/333 |
| 4,677,691 | 6/1987 | Scott | 455/332 |
| 4,751,744 | 6/1988 | Pavio, Jr. | 455/333 |
| 4,876,744 | 10/1989 | Endo et al. | 455/326 |
| 4,885,802 | 12/1989 | Ragan | 455/344 |
| 4,896,374 | 1/1990 | Waugh et al. | 455/326 |
| 4,947,062 | 8/1990 | Weiner et al. | 307/271 |
| 5,125,111 | 6/1992 | Trinh | 455/330 |

FOREIGN PATENT DOCUMENTS

| | | | |
|---|---|---|---|
| 2586872 | 3/1987 | France | 455/333 |

OTHER PUBLICATIONS

Nobuo Shiga, "MMIC Family for DBS Downconverter with Pulse–doped GaAs Mesfets", 20–23 Oct. 1991, pp. 139–142 (1991 IEEE).

Samuel J. Parisi, Applied Microwave, Aug./Sep. 1989, pp. 84–93.

Alejandro Chu, IEEE transactions on electron devices, vol. Ed. 28, No. 2, Feb. 1981, pp. 149–154.

Alejandro Chu, IEEE international Solid–State Circuits Conference, Feb. 1981, pp. 144–145.

Kennan, IEEE 1984, pp. 41–44.

Primary Examiner—Edward F. Urban
Assistant Examiner—Nguyen Vo

[57] ABSTRACT

A monolithic high frequency downconverter which utilizes a three-stage low-noise amplifier, a singly balanced mixer, and a two-stage intermediate frequency amplifier. The downconverter is suitable for applications in a range of systems utilizing EHF frequencies, such as satellites, or phased array antennas. Other applications include RF front end of smart weapons operating at frequencies ranging from 35 to 94 GHz, and avionic systems employing channelized receivers and EW (electronic warfare) systems. The three-stage low-noise amplifier employs four-gate finger HEMT devices for reduced gate resistance and source impedance matching. The singly balanced active HEMT mixer employs a compact 180_ rat-race hybrid ring which significantly reduces the chip size and provides low conversion loss, high LO to RF isolation, high output, IP$_3$ and high-spur rejection as compared to single-ended mixer designs. The circuit design techniques of the present invention are applicable at frequencies ranging from 10 to 100 GHz. AlGaAs/GaAs HEMT and AlGaAs/InGaAs HEMT versions have been produced. The downconverter of the present invention eliminates hybrid assembly and tuning, has a smaller size, lighter weight, and lower DC power consumption.

9 Claims, 3 Drawing Sheets

2

HIGH ELECTRON MOBILITY TRANSISTOR MONOLITHIC INTEGRATED CIRCUIT RECEIVER

This is a continuation of U.S. patent application Ser. No. 07/793,909, filed Nov. 18, 1991, now abandoned.

BACKGROUND OF THE INVENTION

1. Technical Field

This invention relates to integrated circuits and, more particularly, to a microwave monolithic downconverter integrated circuit.

2. Discussion

Gallium arsenide (GaAs) circuits have greatly improved the performance of microwave electronic devices. However, most GaAs microwave devices in use are discrete devices such as transistors, since many of the technical problems involved with incorporating more complex circuitry of this type on single monolithic chips have not been overcome. As a result, microwave integrated circuits in general are hybrid devices comprising a combination of discrete devices and monolithic devices assembled on a single substrate. Unfortunately, such hybrids are more costly, bulky and power hungry than monolithic integrated circuits would be.

Further advances in GaAs technology have resulted in high electron mobility transistors (HEMT) which further improve the performance of microwave devices. However, the use of HEMT transistors in hybrid circuits still result in the aforementioned disadvantages inherent in the hybrid technology.

Thus, it would be desirable to provide a monolithic microwave integrated circuit to avoid the disadvantages of hybrid processes. Further it would be desirable to provide such a circuit which takes full advantage of the HEMT GaAs technology. Also, it would be desirable to provide a monolithic microwave integrated circuit which is less costly, bulky and power hungry than conventional hybrid microwave integrated circuits.

SUMMARY OF THE INVENTION

Pursuant to the present invention, a monolithic microwave integrated circuit downconverter is provided which includes an RF input and a low-noise HEMT amplifier coupled to the input. Also, the invention includes a local oscillator input which is coupled to a singly balanced active HEMT mixer. The mixer also receives the output of the low-noise amplifier, and provides an output signal that has a frequency which is the difference signal between the amplifier output and the local oscillator. Also, an intermediate frequency amplifier is coupled to the mixer output. The downconverter is constructed on a single chip and results in a much smaller and lighter downconverter which consumes less power and is less costly than conventional hybrid downconverters.

BRIEF DESCRIPTION OF THE DRAWINGS

The various advantages of the present invention will become apparent to one skilled in the art by reading the following specification and by reference to the following drawings in which.

DETAILED DESCRIPTION OF THE PREFERRED EMBODIMENT

Figure 1:
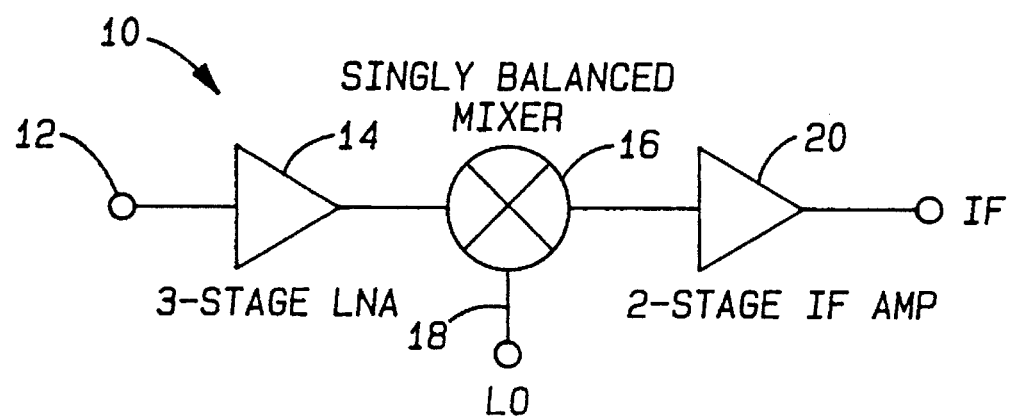
FIG. 1 is a circuit diagram of the main components of the downconverter in accordance with the present invention.

Referring now to FIG. 1, a downconverter circuit 10 in accordance with the present invention is shown. An RF input 12 leads to a three-stage low-noise amplifier 14 whose output is received by a singly balanced mixer 16. A local oscillator (not shown) transmits a signal along line 18 to a second input in the mixer 16. The mixer output has a frequency which is the difference between the RF input and the local oscillator input. This intermediate frequency (IF) is transmitted to the input of a two-stage IF amp 20.

In more detail, the downconverter 10 accepts signals in the range of 43.5 to 45.5 GHz. The downconverter, because of its small size, low weight and low power consumption, is suitable for many uses such as in next-generation communications satellites.

The downconverter 10 employs a number of design concepts which contribute to the high-performance and small size of the single chip device. The RF signal 12 is received by a three-stage low-noise amplifier (LNA) 14 which, in the preferred embodiment, comprises a high electron mobility transistor (HEMT) amplifier which employs four-gate finger HEMT devices for reduced gate resistance and source impedance matching. This results in a low-noise figure and high gain.

Figure 3:
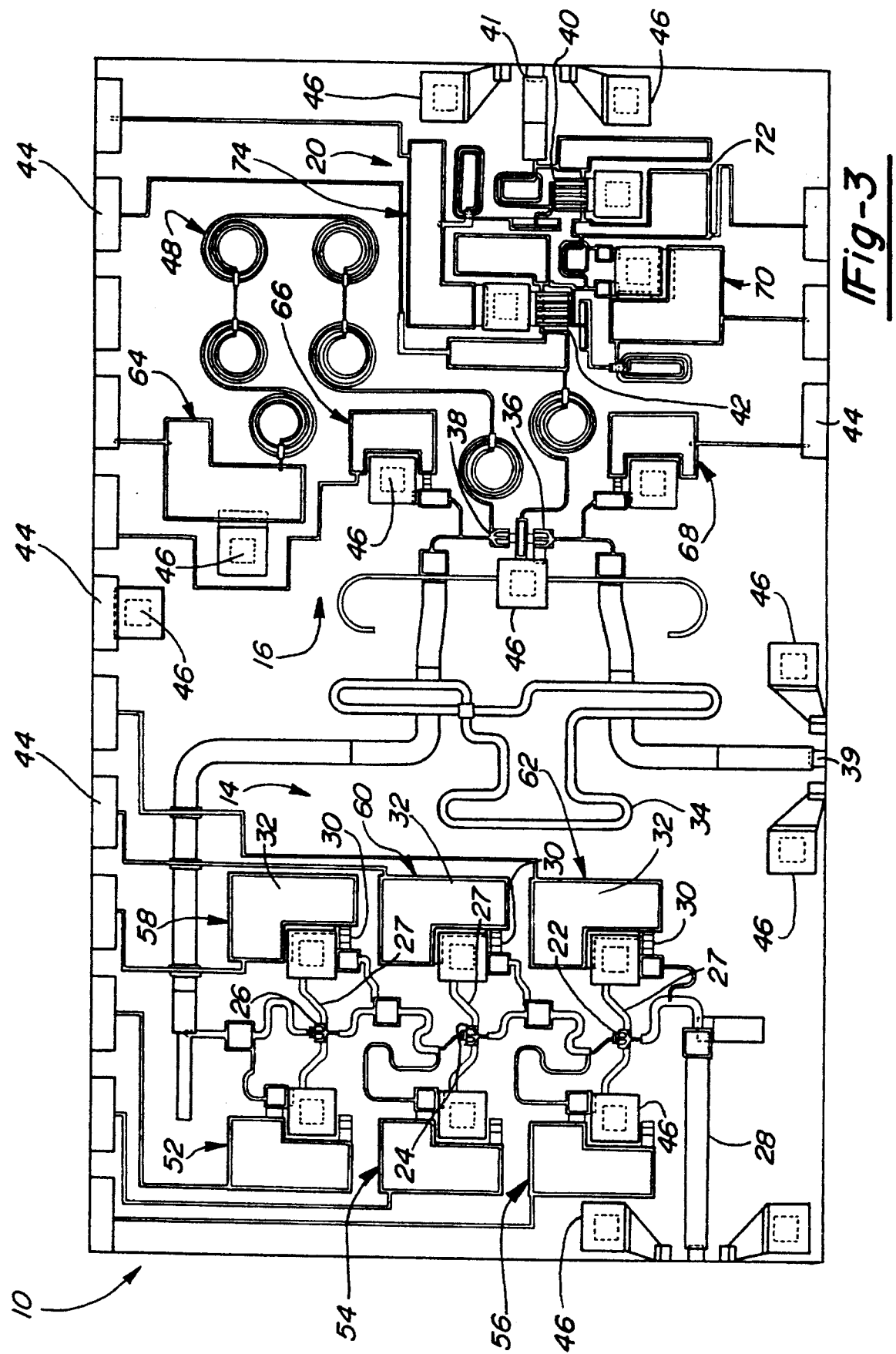
FIG. 3 is a layout of the monolithic downconverter in accordance with a preferred embodiment of the present invention.

Referring to FIG. 3, the circuit topology of the downconverter 10 in accordance with the preferred embodiment is shown. Three low-noise amplifier HEMTs 22, 24, and 26 are shown as part of the three-stage LNA 14. The input to the low-noise amplifier 14 is a 50 ohm microstrip line 28. Each stage of the low-noise amplifier 14 includes a thin film resistor 30 as well as a metal-insulator-metal (MIM) capacitor 32.

The singly balanced HEMT mixer 16 employs a very compact 180° hybrid rat-race ring 34 which significantly reduces the chip size, resulting in higher yields and lower cost. It will be appreciated that the rat-race ring 34 separates in-phase and out of phase components of the signal. The hybrid rat-race ring is folded back on itself. DC bypass/termination networks 33 are included on the chip which contribute to the stability of the circuits. The use of a singly balanced mixer as opposed to a single ended mixer, provides low conversion loss (i.e., high conversion gain), high LO to RF isolation, high output $IP_3$ (intermodulation product), and high-spur rejection. It will be appreciated that single-ended mixers have only one active mixing element while the singly balanced mixer 16 has two active mixing elements, 36 and 38, having signals fed into them 180° out of phase. The signals are recombined at the intermediate frequency, in-phase. As a result, some of the harmonic distortion and phase noise is cancelled out.

The local oscillator signal line 18 is shown as 50 ohm microstrip 39. The two-stage IF amp 20 includes two HEMT amplifiers 40 and 42. Fifteen bias pads 44 are used to insert DC power to the devices. Ground vias 46 are also shown. The IF amp output is transmitted along a 50 ohm microstrip line 41. Also shown in FIG. 3 are ground vias as well as spiral inductors 48 which are used to form a low pass filter for bias insertion and termination of the mixer drain. Each stage of the low-noise amplifier 14 includes source inductors 27 for the purpose of optimizing noise and gain impedance matching. Also, the LNA 14, the mixer 16 and the IF amp 20 include a number of DC bypass/termination networks 52–74.

Figure 2:
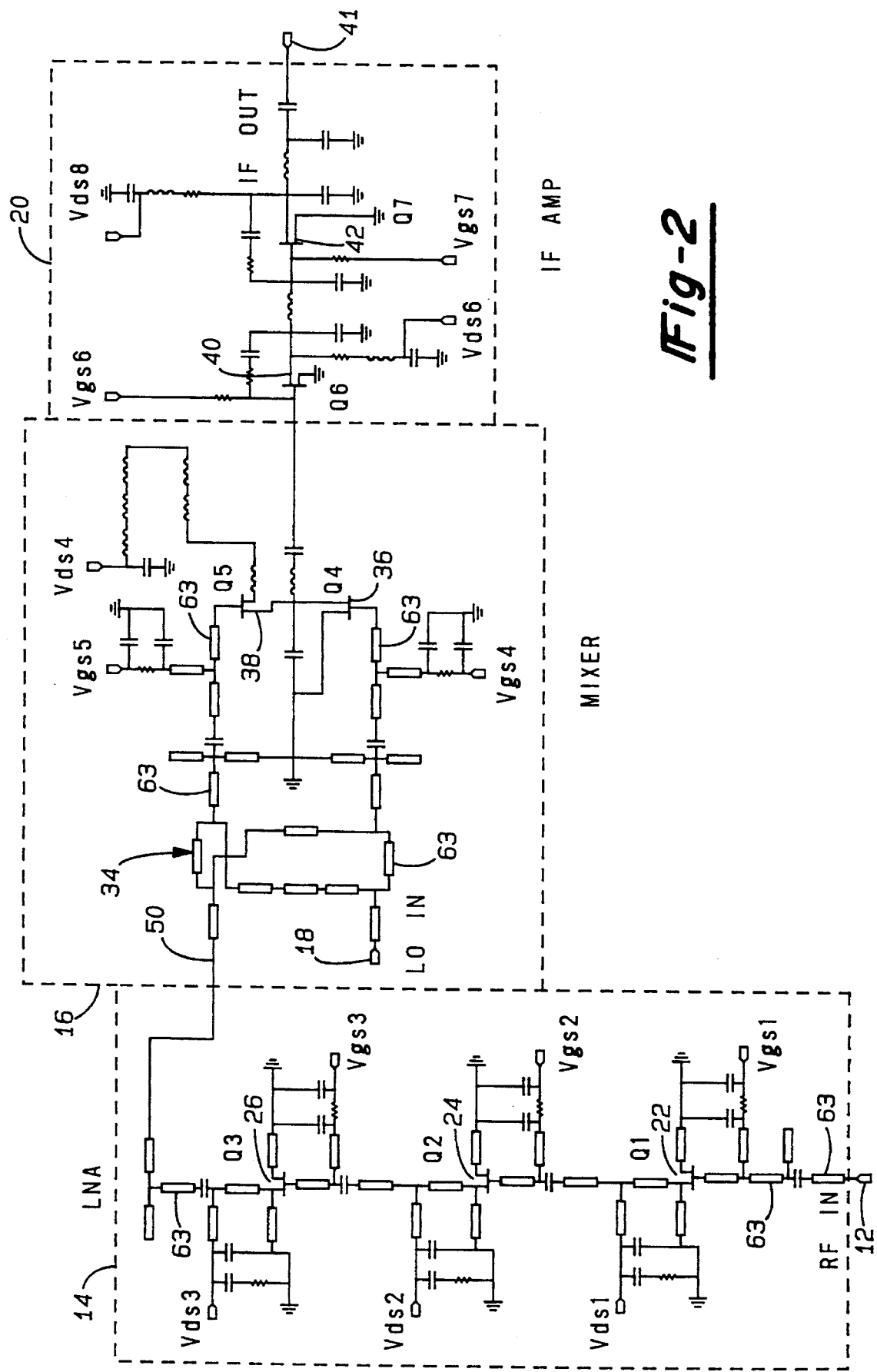
FIG. 2 is a schematic showing more detail of the circuit components of the downconverter shown in FIG. 1.

Referring now to FIG. 2, there is shown a schematic of the downconverter 10 in accordance with a preferred embodiment of the present invention. An RF signal enters the low-noise amplifier 14 at line 12. The signal is amplified by the three amplifier stages. In more detail, each amplifier stage includes HEMT transistors 22,24, and 26. It will be appreciated that primarily the resistors and capacitors are used for blocking or terminating for the bias lines, and are functioning as dc elements.

Microstrip transmission lines 63 carry rf signals which are shown in a simplified manner as rectangles. The amplifier 14 output is fed to the mixer 16 along line 50. The mixer 16 includes two HEMTs 36 and 38 as well as the 180° hybrid rat-race ring 34. The mixer output is the difference between the RF and LO frequencies.

The local oscillator input to the mixer is along line 18. The two-stage IF amp 20 has two HEMTs 40 and 42. Finally, the IF output is transmitted along line 41, where it is used in later stages of a receiving circuit.

It should be noted that the HEMT devices can be fabricated in either AlGaAs/GaAs and AlGaAs/InGaAs HEMT versions. Of course, other HEMT materials can be used also. In the preferred embodiment, an AlGaAs/InGaAs version produced a higher gain (25 dB compared to 15 dB for the AlGaAs/GaAs version).

It should also be noted that the DC bypass termination networks are included on-chip which contributes to the stability of the circuits. Further, the downconverter 10 can be used at frequencies ranging from 10 to 100 GHz. It will be appreciated that computer-aided design techniques are preferred to optimize the circuit-performance, because once the monolithic circuit is put together, there is no way to tune it. Therefore, computer-aided design enables the simulation of the details of all three circuit components in the downconverter 10 to account for all of the active and passive elements in great detail in software before building the chip.

Figure 4:
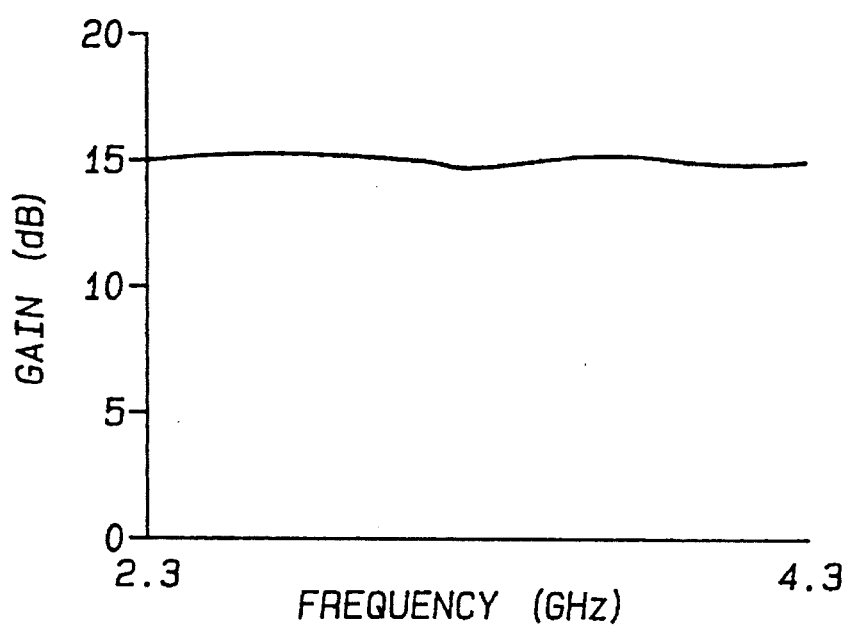
FIG. 4 is a graph of the IF output of the downconverter versus frequency in accordance with the present invention.

In the preferred embodiment, the downconverter 10 accepts RF signals between 43.5 to 45.4 GHz; LO signals at 41.3 GHz (+10 dBm) and produces an IF signal between 2.3 to 4.3 GHz (>0 dBm). For AlGaAs/GaAs HEMTs the conversion gain is greater than 15 dB and the dc power consumption (Pdc) is 330 mW. FIG. 4 illustrates that the gain is relatively constant at about 15 dB from 2.3 GHz to 4.3 GHz It can be seen from the foregoing that the present invention provides a monolithic downconverter 10 which is much smaller than the previous hybrid circuits. For example, it may be constructed on a chip measuring 2.34 by 4 mm. Thus, a size advantage of factor of 10 to 300 is possible. As a result, the circuit is on the order of three times lighter and consumes about half the DC power of a hybrid MIC receiver. Another advantage is lower production costs due to the elimination of hybrid assembly and tuning. Of course, the downconverter 10 is but one way of implementing the present invention and other versions may use amplifiers having a different number of stages and other variations in the mixer design are possible.

Those skilled in the art can appreciate that other advantages can be obtained from the use of this invention and that modifications may be made without departing from the true spirit of the invention after studying the specification, drawings, and following claims.

What is claimed is:

1. A monolithic microwave downconverter for generating an amplified intermediate frequency (IF) output from a microwave frequency input comprising:

a low-noise amplifier including at least one high electron mobility transistor (HEMT) coupled to said microwave frequency input;

a singly balanced active mixer, coupled to an output of said low-noise amplifier, including, an 180° hybrid rat-race ring, having a first input coupled to said low noise amplifier and a second input coupled to an output of a local oscillator, for generating first and second outputs which are 180° out of phase, a first mixing element having an input coupled to said first output of said 180° hybrid rat-race ring, and a second mixing element having an input coupled to said second output of said 180° hybrid rat-race ring and having an output coupled to an output of said first mixing element, wherein said first mixing element includes a common-drain transistor, said second mixing element includes a common-source transistor connected to said common-drain transistor in a cascode configuration, and wherein said first and second mixing elements recombine said first and second outputs from said 180° hybrid rat-race ring to cancel harmonic distortion, to reduce phase noise, and to produce an in-phase mixer output, at said coupled outputs of said first and second mixer elements, having an intermediate frequency which is the difference between said output of said low-noise amplifier and said output of the local oscillator; and an IF amplifier coupled to said in-phase mixer output, wherein said low-noise amplifier, said mixer and said IF amplifier are implemented on a single monolithic circuit.

2. The monolithic microwave downconverter of claim 1 wherein said low-noise amplifier is a three-stage amplifier.

3. The monolithic microwave downconverter of claim 2 wherein said low-noise amplifier includes at least one four-gate finger HEMT.

4. The monolithic microwave downconverter of claim 1 wherein said 180° hybrid rat-race ring is folded back on itself.

5. The monolithic microwave downconverter of claim 1 wherein said low-noise amplifier amplifies signals in the range of 43.5 to 45.5 GHz, and said IF amplifier receives signals in the range of 2.3 to 4.3 GHZ.

6. The monolithic microwave downconverter of claim 1 wherein said IF amplifier is a two-stage amplifier.

7. The monolithic microwave downconverter of claim 1 wherein said low-noise amplifier is produced using AlGaAs/GaAs.

8. A monolithic microwave downconverter for generating an amplified intermediate frequency (IF) output from a microwave frequency input comprising:

a three-stage low-noise amplifier coupled to said microwave frequency input and including at least one high electron mobility transistor (HEMT) in each stage;

a singly balanced active mixer, coupled to an output of said low-noise amplifier, including an 180° hybrid rat-race ring, folded back on itself and having a first input coupled to said low noise amplifier an a second input coupled to an output of a local oscillator, for generating first and second outputs which are 180° out of phase, a first HEMT mixing element connected as a common-drain circuit and having an input coupled to said first output of said 180° hybrid rat-race ring, and a second HEMT mixing element connected as a common-source circuit, having an input coupled to said second output of said 180° hybrid rat-race ring and having an output coupled to an output of said first HEMT mixing element, wherein said first and second HEMT mixing elements are connected in a cascode configuration, and wherein said first and second HEMT mixing elements recombine said first and second outputs from said 180° hybrid rat-race ring to cancel harmonic distortion, to reduce phase noise, and to produce an in-phase mixer output, at said coupled outputs of said first and second HEMT mixing elements, having an intermediate frequency (IF) which is the difference between said output of said low-noise amplifier and said output of the local oscillator; and a two-stage IF amplifier coupled to said in-phase mixer output of said first and second HEMT mixing elements, wherein said low-noise amplifier, said mixer and said IF amplifier are implemented on a single monolithic integrated circuit and wherein said three-stage low-noise amplifier is produced using AIGaAs/InGaAs.

9. A monolithic microwave downconverter for generating an amplified intermediate frequency (IF) output from a microwave frequency input comprising:

a low-noise amplifier including at least one high electron mobility transistor (HEMT) coupled to said microwave frequency input;

a singly balanced active mixer, coupled to an output of said low-noise amplifier, including, an 180° hybrid rat-race ring, having a first input coupled to said low noise amplifier and a second input coupled an output of a local oscillator, for generating first and second outputs which are 180° out of phase, a first mixing element having an input coupled to said first output of said 180° hybrid rat-race ring; and a second mixing element having an input coupled to said second output of said 180° hybrid rat-race ring and having an output coupled to an output of said first mixing element, wherein said first mixing element includes a common-drain transistor and said second mixing element includes a transistor having a drain connected to a source of said common-drain transistor; and wherein said first and second mixing elements recombine said first and second outputs from said 180° hybrid rat-race ring to cancel harmonic distortion, to reduce phase noise, and to produce an in-phase mixer output, at said coupled outputs of said first and second mixer elements, having an intermediate frequency which is the difference between said output of said low-noise amplifier and said output of the local oscillator; and an IF amplifier coupled to said in-phase mixer and wherein said low-noise amplifier, said mixer and said IF amplifier are implemented on a single monolithic circuit.

\* \* \* \* \*